United States Patent
Son et al.

(10) Patent No.: US 11,502,051 B2
(45) Date of Patent: Nov. 15, 2022

(54) SEMICONDUCTOR CHIP INCLUDING THROUGH ELECTRODE, AND SEMICONDUCTOR PACKAGE INCLUDING THE SAME

(71) Applicant: SK hynix Inc., Icheon-si (KR)

(72) Inventors: Ho Young Son, Icheon-si (KR); Sung Kyu Kim, Icheon-si (KR); Ju Heon Yang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 16 days.

(21) Appl. No.: 17/171,881

(22) Filed: Feb. 9, 2021

(65) Prior Publication Data
US 2022/0084968 A1     Mar. 17, 2022

(30) Foreign Application Priority Data
Sep. 16, 2020  (KR) .......................... 10-2020-0118873

(51) Int. Cl.
*H01L 23/00*     (2006.01)
*H01L 23/48*     (2006.01)
*H01L 25/065*    (2006.01)

(52) U.S. Cl.
CPC ............ *H01L 24/06* (2013.01); *H01L 23/481* (2013.01); *H01L 24/05* (2013.01); *H01L 24/16* (2013.01); *H01L 24/17* (2013.01); *H01L 25/0657* (2013.01); *H01L 24/73* (2013.01); *H01L 2224/0557* (2013.01);
(Continued)

(58) Field of Classification Search
CPC ....... H01L 24/06; H01L 23/481; H01L 24/05; H01L 24/16; H01L 24/17; H01L 25/0657; H01L 24/73; H01L 2224/0557; H01L 2224/0603; H01L 2224/06181; H01L 2224/06517; H01L 2224/16145; H01L 2224/17051; H01L 2224/17181; H01L 2224/17517; H01L 2224/73204; H01L 2225/06513; H01L 2225/06517; H01L 2225/06544; H01L 2225/06565
See application file for complete search history.

(56) References Cited

U.S. PATENT DOCUMENTS

| | | | | |
|---|---|---|---|---|
| 2011/0084365 | A1* | 4/2011 | Law | H01L 24/73 257/784 |
| 2013/0134421 | A1* | 5/2013 | Takakura | H01L 23/481 438/18 |

(Continued)

FOREIGN PATENT DOCUMENTS

| | | | | |
|---|---|---|---|---|
| CN | 113540059 A | * | 10/2021 | ............. H01L 24/08 |
| KR | 101840447 B1 | | 3/2018 | |

*Primary Examiner* — Mamadou L Diallo
(74) *Attorney, Agent, or Firm* — William Park & Associates Ltd.

(57) ABSTRACT

A semiconductor chip includes a body portion with a front surface and a rear surface; a through electrode penetrating the body portion; a wiring portion that is disposed over the front surface of the body portion; a rear connection electrode that is disposed over the rear surface of the body portion; and a front connection electrode that is disposed over the wiring portion, wherein the rear connection electrode includes a power rear connection electrode that is simultaneously connected to two or more power through electrodes, and wherein a width of the power rear connection electrode is greater than a width of the front connection electrode.

26 Claims, 6 Drawing Sheets

(52) U.S. Cl.
CPC ............... *H01L 2224/0603* (2013.01); *H01L 2224/06181* (2013.01); *H01L 2224/06517* (2013.01); *H01L 2224/16145* (2013.01); *H01L 2224/17051* (2013.01); *H01L 2224/17181* (2013.01); *H01L 2224/17517* (2013.01); *H01L 2224/73204* (2013.01); *H01L 2225/06513* (2013.01); *H01L 2225/06517* (2013.01); *H01L 2225/06544* (2013.01); *H01L 2225/06565* (2013.01)

(56) References Cited

U.S. PATENT DOCUMENTS

| | | | |
|---|---|---|---|
| 2013/0249011 A1* | 9/2013 | Choi | H01L 21/823807 |
| | | | 257/369 |
| 2014/0048918 A1* | 2/2014 | Nagaune | H01L 24/40 |
| | | | 438/122 |
| 2016/0079133 A1* | 3/2016 | Nashida | H01L 23/053 |
| | | | 257/690 |
| 2018/0366456 A1* | 12/2018 | Jeong | H01L 23/481 |
| 2019/0386179 A1* | 12/2019 | Moriyasu | H01L 33/40 |
| 2020/0381587 A1* | 12/2020 | Watanabe | H01L 33/20 |
| 2021/0143127 A1* | 5/2021 | Jain | H01L 25/50 |
| 2021/0249503 A1* | 8/2021 | Schmidt | H01L 23/5227 |
| 2021/0373472 A1* | 12/2021 | Suzuki | G03G 15/2017 |
| 2021/0384162 A1* | 12/2021 | Choi | H01L 24/06 |
| 2022/0037300 A1* | 2/2022 | Nakamura | H01L 33/44 |

* cited by examiner

SEMICONDUCTOR CHIP INCLUDING THROUGH ELECTRODE, AND SEMICONDUCTOR PACKAGE INCLUDING THE SAME

CROSS-REFERENCE TO RELATED APPLICATION

This application claims priority under 35 U.S.C. § 119 to Korean Patent Application No. 10-2020-0118873 filed on Sep. 16, 2020, which is incorporated herein by reference in its entirety.

BACKGROUND

1. Technical Field

This patent document relates to a semiconductor technology, and more particularly, to a semiconductor chip including a through electrode, and a semiconductor package including the semiconductor chip.

2. Related Art

Electronic products require multifunctional and high-volume data processing while their sizes are getting smaller. Accordingly, semiconductor chips used in such electronic products are also required to have a thin thickness and a small size. Further, a semiconductor package in which a plurality of semiconductor chips are embedded has been manufactured.

The plurality of semiconductor chips may be connected to each other by a through via passing through each semiconductor chip and providing an electrical connection path.

SUMMARY

In an embodiment, a semiconductor chip may include: a body portion with a front surface and a rear surface; a through electrode penetrating the body portion; a wiring portion that is disposed over the front surface of the body portion; a rear connection electrode that is disposed over the rear surface of the body portion; and a front connection electrode that is disposed over the wiring portion, wherein the rear connection electrode includes a power rear connection electrode that is simultaneously connected to two or more power through electrodes, and wherein a width of the power rear connection electrode is greater than a width of the front connection electrode.

In another embodiment, a semiconductor chip may include: a body portion with a front surface and a rear surface; a through electrode penetrating the body portion; and a rear connection electrode that is disposed over the rear surface of the body portion, wherein the rear connection electrode includes a power rear connection electrode that is simultaneously connected to two or more power through electrodes, and wherein a width of the power rear connection electrode is greater than that of other rear connection electrodes that are not the power rear connection electrode.

In another embodiment, a semiconductor package may include: a first semiconductor chip including a first body portion with a front surface and a rear surface, a first through electrode penetrating the first body portion, and a first rear connection electrode that is disposed over the rear surface of the first body portion; and a second semiconductor chip including a second body portion with a front surface and a rear surface, a second wiring portion that is disposed over the front surface of the second body portion, and a second front connection electrode that is disposed over the second wiring portion, wherein the first rear connection electrode and the second front connection electrode are electrically connected to each other, the first rear connection electrode includes a first power rear connection electrode that is simultaneously connected to two or more first power through electrodes, and a width of the first power rear connection electrode is greater than a width of the second front connection electrode.

In an embodiment, a semiconductor chip may include: a body portion with a front surface and a rear surface; a plurality of through electrodes penetrating the body portion; a wiring portion that is disposed over the front surface of the body portion; a plurality of rear connection electrodes that are disposed over the rear surface of the body portion to be connected to respective through electrodes; and a plurality of front connection electrodes that are disposed over the wiring portion to be connected to respective through electrodes, wherein one or more of the rear connection electrodes are simultaneously connected to two or more through electrodes, and wherein a width of the one or more of the rear connection electrodes that are simultaneously connected to two or more through electrodes is greater than a width of the front connection electrode.

DETAILED DESCRIPTION

Figure 1:
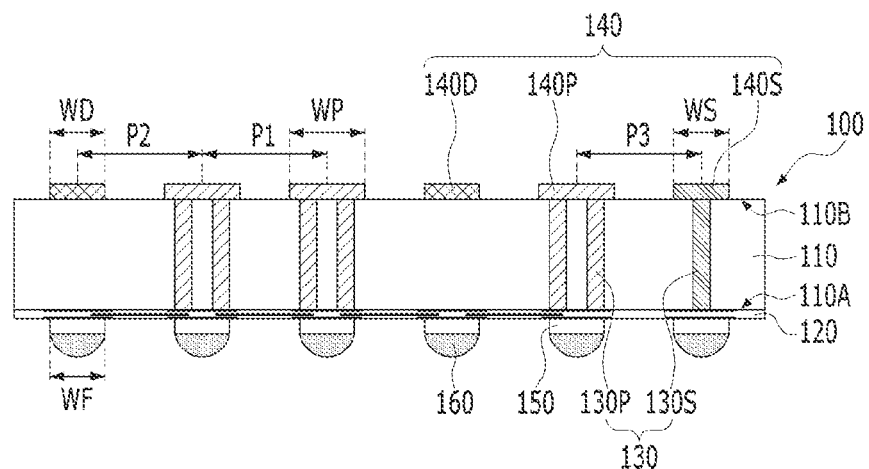
FIG. 1 is a cross-sectional view, illustrating a semiconductor chip, according to an embodiment of the present disclosure.

Hereinafter, various embodiments of the disclosure will be described in detail with reference to the accompanying drawings.

The drawings are not necessarily drawn to scale. In some instances, proportions of at least some structures in the drawings may have been exaggerated in order to clearly illustrate certain features of the described embodiments. In presenting a specific example in a drawing or description with two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated mufti-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIG. 1 is a cross-sectional view, illustrating a semiconductor chip, according to an embodiment of the present disclosure.

Referring to FIG. 1, a semiconductor chip 100 of the present embodiment may include a body portion 110, a wiring portion 120, a through electrode 130, a rear connection electrode 140, a front connection electrode 150, and a bonding layer 160.

The body portion 110 may be formed of a semiconductor material, such as silicon or germanium, and may have a front surface 110A, a rear surface 110B, and a side surface that connect them to each other. The front surface 110A of the body portion 110 may refer to an active surface on which the wiring portion 120 is disposed, and the rear surface 110B of the body portion 110 may refer to a surface that is located on the opposite side of the front surface 110A.

The wiring portion 120 may be formed over the front surface 110A of the body portion 110. The wiring portion 120 may include a circuit/wiring structure that is electrically connected to the through electrode 130. For convenience of description, the circuit/wiring structure is simply illustrated as lines in the wiring portion 120, but is not limited thereto. In this case, the circuit/wiring structure may be variously implemented based on the type of the semiconductor chip 100. For example, when the semiconductor chip 100 includes volatile memory, such as DRAM (Dynamic Random Access Memory) or SRAM (Static RAM), or non-volatile memory, such as NAND flash, RRAM (Resistive RAM), PRAM (Phase-change RAM), MRAM (Magneto-resistive RAM), or FRAM (Ferroelectric RAM), the circuit/wiring structure may include a memory cell array with a plurality of memory cells.

The through electrode 130 may be formed in the body portion 110. The through electrode 130 may have a pillar shape that extends from the front surface 110A to the rear surface 110B to penetrate the body portion 110. As an example, the through electrode 130 may be a TSV (Through Silicon Via). The through electrode 130 may include various conductive materials. As an example, the through electrode 130 may include metal, such as copper (Cu), tin (Sn), silver (Ag), tungsten (W), nickel (Ni), ruthenium (Ru), cobalt (Co), or a compound of this metal. Although not shown, an insulating liner that insulates the through electrode 130 and the body portion 110 from each other may be interposed between the through electrode 130 and the body portion 110. Further, although not shown, a barrier metal layer that prevents diffusion of the metal of the through electrode 130 may be formed to surround a sidewall of the through electrode 130. One end of the through electrode 130 may be connected to the wiring portion 120, and the other end of the through electrode 130 may be connected to the rear connection electrode 140.

In this case, the through electrode 130 may include a signal through electrode 130S that transmits a signal and a power through electrode 130P that supplies power. The signal may include various signals that are required for driving the semiconductor chip 100. As an example, when the semiconductor chip 100 includes memory, signals, such as a data input/output signal (DQ), a command/address signal (CA), or a chip selection signal (CS) may move through the signal through electrode 130S. Also, the power may include various levels of power voltages or a ground voltage that are required to drive the semiconductor chip 100. In the present embodiment, one signal through electrode 130S and six power through electrodes 130P are illustrated, but the present disclosure is not limited thereto, and the number of the signal through electrodes 130S and the number of the power through electrodes 130P may vary. In a horizontal direction, that is, in a direction that is parallel to the front surface 110A and the rear surface 110B of the body portion 110, the width of the through electrodes 130 may be constant. That is, the width of each signal through electrode 130S and the width of each power through electrode 130P may be the same.

The rear connection electrode 140 may be formed over the rear surface 110B of the body portion 110. The rear connection electrode 140 may connect the through electrode 130 to another component, for example, another semiconductor chip to be located over the rear surface 110E of the semiconductor chip 100. As an example, the rear connection electrode 140 may include a conductive bump. The rear connection electrode 140 may include various metal materials, such as copper, nickel, or a combination thereof, and may have a single-layered structure or a mufti-layered structure.

The rear connection electrode 140 may include a signal rear connection electrode 140S that is connected to the signal through electrode 130S, a power rear connection electrode 140P that is connected to the power through electrode 130P, and a dummy rear connection electrode 140D that is not connected to the through electrode 130.

The signal rear connection electrode 140S may be formed to overlap and connect with each signal through electrode 130S. One signal rear connection electrode 140S may correspond to one signal through electrodes 130S. In the horizontal direction, a width WS of the signal rear connection electrode 140S may be greater than the width of the signal through electrode 130S.

The power rear connection electrode 140P may be formed to simultaneously connect with a pair of power through electrodes 130P. That is, one power rear connection electrode 140P may correspond to two power through electrodes 130P. The pair of power through electrodes 130P may be spaced apart from each other with a part of the body portion 110 therebetween. For this reason, the power rear connection electrode 140P may have a width/size that overlaps with the pair of power through electrodes 130P and a space therebetween. As a result, the width WP of the power rear connection electrode 140P may be greater than the width WS of the signal rear connection electrode 140S.

The dummy rear connection electrode 140D may be in an electrical floating state. The dummy rear connection electrode 140D may function to maintain process stability in a process of stacking a plurality of semiconductor chips to be described later, which improves the heat dissipation characteristics in a semiconductor package that includes the plurality of stacked semiconductor chips. This will be described in more detail in the relevant section. The width WD of the dummy rear connection electrode 140D may be substantially the same as the width WS of the signal rear connection electrode 140S. In addition, the width WD of the dummy rear connection electrode 140D may be smaller than the width WP of the power rear connection electrode 140P. If necessary, the dummy rear connection electrode 140D may be omitted.

Despite the difference in width/size of the signal rear connection electrode 140S, the power rear connection electrode 140P, and the dummy rear connection electrode 140D, the pitch of the rear connection electrodes 140 (that is, the distance between the center of the rear connection electrode 140 and the center of the adjacent rear connection electrode 140) may be constant. For example, as shown, the pitch P1 between two adjacent power rear connection electrodes 140P, the pitch P2 between the power rear connection electrode 140P and the dummy rear connection electrode 140D that are adjacent to each other, and the pitch P3 between the power rear connection electrode 140P and the signal rear connection electrode 140S that are adjacent to each other, may have a fixed value. In this case, because the width/size of the power rear connection electrode 140P is relatively large, the space between the power rear connection electrode 140P and the rear connection electrode 140 that are adjacent thereto may be decreased. However, as will be described later, the width/size of the front connection electrode 150 may be kept constant, thereby preventing an electrical short due to such a decrease in the space. This will be described in more detail in the relevant section.

The front connection electrode 150 may be formed over the wiring portion 120. The front connection electrode 150 may be for electrical connecting to another component, for example, another semiconductor chip or a substrate to be positioned over the front surface 110A of the semiconductor chip 100. The front connection electrode 150 may include a conductive bump. The front connection electrode 150 may include various metal materials, such as copper, nickel, or a combination thereof, and may have a single-layered structure or a multi-layered structure.

The front connection electrode 150 may be electrically connected to the wiring portion 120. Furthermore, the front connection electrode 150 may be electrically connected to the through electrode 130 through the wiring portion 120. That is, unlike the rear connection electrode 140, the front connection electrode 150 might not directly contact the through electrode 130. For this reason, even if the front connection electrode 150 is electrically connected to the pair of power through electrodes 130P at the same time, the size of the front connection electrode might not need to increase. This is due to the fact that the circuit/wiring structure that is included in the wiring portion 120 connects the pair of power through electrodes 130P to each other and is connected to the front connection electrode 150. The width WF of the front connection electrode 150 may be substantially the same as the width WS of the signal rear connection electrode 140S and/or the width WD of the dummy rear connection electrode 140D. The width WF of the front connection electrode 150 may be smaller than the width WP of the power rear connection electrode 140P. The plurality of front connection electrodes 150 may have the same width/size. The front connection electrode 150 may be disposed at a position that corresponds to the rear connection electrode 140. The front connection electrode 150 may be disposed so that the center thereof substantially overlaps the center of the rear connection electrode 140. The pitch between the front connection electrodes 150 may be the same as the pitch between the rear connection electrodes 140.

The bonding layer 160 may be formed over a surface of the front connection electrode 150, which is located on the opposite side of a surface in contact with the wiring portion 120. When a plurality of semiconductor chips 100 are stacked in a vertical direction, that is, in a direction that is perpendicular to the front surface 110A and the rear surface 110B of the body portion 110, the bonding layer 160 may be bonded to the rear connection electrode 140 that faces itself. The bonding layer 160 may include a solder material with a hemispherical shape, a ball shape, or a shape similar thereto. However, the present embodiment is not limited thereto, and the shape and material of the bonding layer 160 may be variously modified.

According to the semiconductor chip 100 that is described above, because one power rear connection electrode 140P is in contact with the pair of power through electrodes 130P at the same time, it may be possible to reduce the resistance of the power supply path through the power rear connection electrode 140P and the pair of power through electrodes 130P. As a result, the power may be easily and stably supplied.

In addition, by maintaining the pitch of the rear connection electrodes 140 and the pitch of the front connection electrodes 150, while increasing the width/size of the power rear connection electrode 140P, it may be possible to accommodate high input/output density requirement of the semiconductor chip 100.

Furthermore, even when a high-density semiconductor package is implemented by stacking the plurality of semiconductor chips 100, the power may be easily and stably supplied, and defects, such as an electrical short between adjacent connection electrodes in the horizontal direction, may be prevented. This will be described in more detail with reference to FIG. 2 below.

Figure 2:
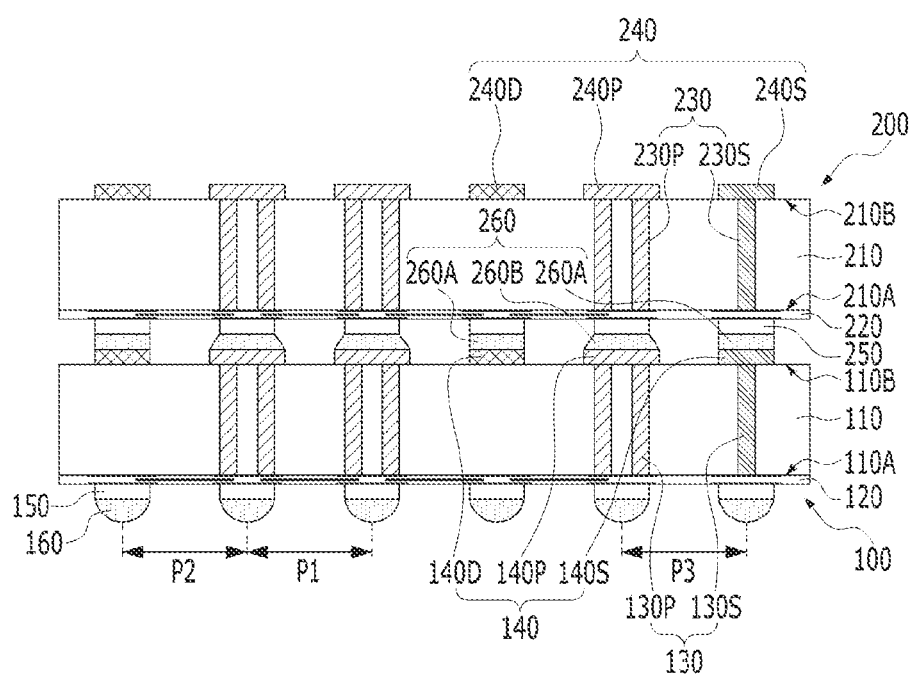
FIG. 2 is a cross-sectional view, illustrating stacked semiconductor chips, according to an embodiment of the present disclosure.

FIG. 2 is a cross-sectional view, illustrating stacked semiconductor chips, according to an embodiment of the present disclosure, FIG. 2 shows a case in which two semiconductor chips are stacked in a vertical direction.

Referring to FIG. 2, a second semiconductor chip 200 may be stacked over a first semiconductor chip 100.

The first semiconductor chip 100 may be substantially the same as the semiconductor chip 100 of FIG. 1 described above. Accordingly, the same reference numerals as those of FIG. 1 are used. The first semiconductor chip 100 may include a first body portion 110 with a front surface 110A and a rear surface 1106, a first wiring portion 120 that is disposed over the front surface 110A of the first body portion 110, a first through electrode 130 that penetrates the first body portion 110, a first rear connection electrode 140 that is disposed over the rear surface 1106 of the first body portion 110 and connected to the first through electrode 130, a first front connection electrode 150 that is disposed over the first wiring portion 120 and connected to the first through electrode 130 through the first wiring portion 120, and a first bonding layer 160 that is disposed over the first front connection electrode 150. The first through electrode 130 may include a first signal through electrode 130S and a first power through electrode 130P. The first rear connection electrode 140 may include a first signal rear connection electrode 140S, a first power rear connection electrode 140P, and a first dummy rear connection electrode 140D.

The second semiconductor chip 200 may also be substantially the same as the semiconductor chip 100 of FIG. 1, except for the shape of a bonding layer 260. That is, the second semiconductor chip 200 may include a second body portion 210 with a front surface 210A and a rear surface 210B, a second wiring portion 220 that is disposed over the front surface 210A of the second body portion 210, a second through electrode 230 that penetrates the second body portion 210, a second rear connection electrode 240 that is disposed over the rear surface 210B of the second body portion 210 and connected to the second through electrode 230, a second front connection electrode 250 that is disposed over the second wiring portion 220 and connected to the second through electrode 230 through the second wiring portion 220, and the second bonding layer 260 that is disposed over the second front connection electrode 250. The second through electrode 230 may include a second signal through electrode 230S and a second power through electrode 230P. The second rear connection electrode 240 may include a second signal rear connection electrode 240S, a second power rear connection electrode 240P, and a second dummy rear connection electrode 240D. The arrangement, pitch, and width of the second through electrode 230, the second rear connection electrode 240, and the second front connection electrode 250 may be substantially the same as the arrangement, pitch, and width of the first through electrode 130, the first rear connection electrode 140, and the first front connection electrode 150.

The second semiconductor chip 200 may be stacked over the first semiconductor chip 100 with the front surface 210A thereof that faces the rear surface 110B of the first semiconductor chip 100. More specifically, the second bonding layer 260 of the second semiconductor chip 200 may be bonded to the first rear connection electrode 140 of the first semiconductor chip 100 through a bonding process. During the bonding process, the shape of the second bonding layer 260 may be modified to be different from the shape of the first bonding layer 160. Among the second bonding layers 260, those that are bonded to the first signal rear connection electrode 140S and the first dummy rear connection electrode 140D are denoted by reference numeral 260A and are referred to as a second normal bonding layer 260A with a shape of a normal bonding layer. On the other hand, among the second bonding layers 260, one to be bonded to the first power rear connection electrode 140P is denoted by reference numeral 260B and is referred to as a second oblique bonding layer 260B with an oblique sidewall, unlike the normal bonding layer. The shapes of the second normal bonding layer 260A and the second oblique bonding layer 260B will be described in more detail with reference to FIGS. 3A and 3B.

Figure 3A:
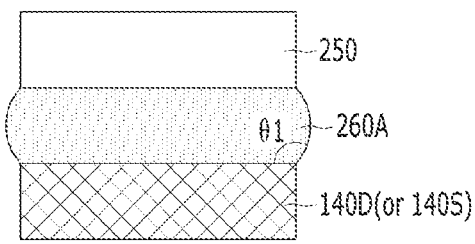
FIG. 3A is a cross-sectional view, illustrating an example of a shape of a second bonding layer, bonded to a first dummy rear connection electrode or a first signal rear connection electrode.
Figure 3B:
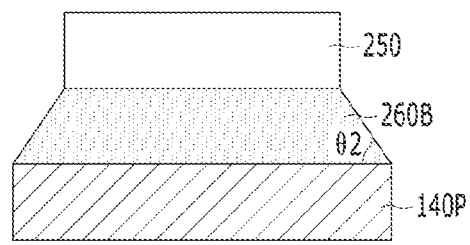
FIG. 3B is a cross-sectional view, illustrating an example of a shape of a second bonding layer, bonded to a first power rear connection electrode.

FIG. 3A is a cross-sectional view, illustrating an example of a shape of a second bonding layer, bonded to a first dummy rear connection electrode or a first signal rear connection electrode, and FIG. 3B is a cross-sectional view, illustrating an example of a shape of a second bonding layer, bonded to a first power rear connection electrode.

Referring to FIG. 3A, the second normal bonding layer 260A that is between the first dummy rear connection electrode 140D and the second front connection electrode 250 or the second normal bonding layer 260A that is between the first signal rear connection electrode 140S and the second front connection electrode 250 may have a sidewall that is convex, protruding past the boundary that is formed by the side surface of the first dummy rear connection electrode 140D or the first signal rear connection electrode 140S due to the pressure that is applied during the bonding process. This is because the width/size of the first dummy rear connection electrode 140D or the first signal rear connection electrode 140S is substantially the same as the width/size of the second front connection electrode 250. In this case, the angle θ1 that is formed by the sidewall of the second normal bonding layer 260A and the horizontal surface, for example, the upper surface of the first dummy rear connection electrode 140D or the first signal rear connection electrode 140S, may be greater than 90 degrees.

On the other hand, referring to FIG. 3B, the second oblique bonding layer 260B that is between the first power rear connection electrode 140P and the second front connection electrode 250 may have a sidewall that does not protrude past the boundary that is formed by the side surface of the first power rear connection electrode 140P, even if pressure is applied during the bonding process. This is due to the fact that the width/size of the first power rear connection electrode 140P is larger than the width/size of the second front connection electrode 250. Accordingly, the second oblique bonding layer 260B may have a shape in which the width of the second oblique bonding layer 260B increases as it approaches the first power rear connection electrode 140P. In this case, the angle θ2 that is formed by the sidewall of the second oblique bonding layer 260B and the horizontal surface, for example, the upper surface, of the first power rear connection electrode 140P, may be less than 90 degrees. This angle θ2 may be smaller than the aforementioned angle θ1.

Referring back to FIG. 2, the first semiconductor chip 100 and the second semiconductor chip 200 that are stacked in the vertical direction may be electrically connected to each other through the stacked structure of the first rear connection electrode 140, the second bonding layer 260, and the second front connection electrode 250.

More specifically, the first signal through electrode 130S may be electrically connected to the second signal through electrode 230S, through the first signal rear connection electrode 140S, the second normal bonding layer 260A, the second front connection electrode 250, and the second wiring portion 220. As a result, an electrical connection path, that is, a signal transmission path, may be formed to pass through the first bonding layer 160, the first front connection electrode 150, the first wiring portion 120, the first signal through electrode 130S, the first signal rear connection electrode 140S, the second normal bonding layer 260A, the second front connection electrode 250, the second wiring portion 220, the second signal through electrode 230S, and the second signal rear connection electrode 240S.

In addition, the pair of first power through electrodes 130P may be electrically connected to the pair of second power through electrodes 230P, through the first power rear connection electrode 140P, the second oblique bonding layer 260B, the second front connection electrode 250, and the second wiring portion 220. As a result, an electrical connection path, that is, a power supply path, may be formed to pass through the first bonding layer 160, the first front connection electrode 150, the first wiring portion 120, the pair of first power through electrodes 130P, the first power rear connection electrode 140P, the second oblique bonding layer 260B, the second front connection electrode 250, the second wiring portion 220, the pair of second power through electrodes 230P, and the second power rear connection electrode 240P.

The stacked structure of the first dummy rear connection electrode 140D, the second normal bonding layer 260A, and the second front connection electrode 250 might not be electrically connected to the first through electrode 130 and the second through electrode 230. That is, this stacked structure may be irrelevant to the electrical connection between the first semiconductor chip 100 and the second semiconductor chip 200. However, this stacked structure may be used as a heat dissipation path. Furthermore, this stacked structure may serve to evenly distribute pressure that is applied during the bonding process between the first semiconductor chip 100 and the second semiconductor chip 200. Furthermore, when the space between the first semiconductor chip 100 and the second semiconductor chip 200 is filled with a gap-fill material (not shown), this stacked structure may also serve to prevent process defects, such as voids in the gap-fill material, by making the speed of the gap-fill material uniform.

In the present embodiment, a case in which two semiconductor chips 100 and 200 are stacked in the vertical direction has been described, but the present disclosure is not limited thereto. In another embodiment, three or more semiconductor chips may be repeatedly stacked in the vertical direction.

Accordingly, it may be possible to implement a high-density semiconductor package in which a plurality of semiconductor chips are stacked in a vertical direction.

In addition, by forming a power supply path that passes through a pair of power through electrodes in such a semiconductor package, the resistance of the power supply path may be reduced compared to a case in which a single power through electrode is used. Accordingly, even if staking the plurality of semiconductor chips causes an increase of the total length of the through-electrodes/the total length of the power supply, the power may be easily and stably supplied to each semiconductor chip.

In addition, the size of the semiconductor package in the horizontal direction may be maintained by maintaining the pitch of the rear connection electrodes and the front connection electrodes of each semiconductor chip while increasing the width/size of the power rear connection electrode.

In addition, by maintaining the width/size of the front connection electrode of each semiconductor chip while increasing the width/size of the power rear connection electrode, it may be possible to prevent an electrical short between connection structures that are disposed between the semiconductor chips and arranged in a horizontal direction. In particular, an electrical short between bonding layers in the horizontal direction may be prevented. In more detail, when the size of the first power rear connection electrode 140P is increased in FIG. 2, the distance between the first power rear connection electrode 140P and another rear connection electrode 140 that is adjacent thereto may decrease. However, even if this distance decreases, the sidewall of the second oblique bonding layer 260B that is bonded to the first power rear connection electrode 140P might not protrude past the boundary that is formed by the side surface of the first power rear connection electrode 140P. This is because the second front connection electrode 250 has a smaller width/size than the first power rear connection electrode 140P. Accordingly, a bridge phenomenon in which the adjacent second bonding layers 260 comes in contact with each other may be prevented, and thus, an electrical short between the stacked structures of the first rear connection electrode 140, the second bonding layer 260, and the second front connection electrode, which are adjacent to each other in the horizontal direction, may be prevented. For reference, because the front and rear connection electrodes do not melt in the bonding process and maintain their shape, an electrical short between the connection structures may be caused by a bridge between the bonding layers. In the present embodiment, it may be possible to block the bridge between the bonding layers.

Furthermore, through a dummy structure between a plurality of semiconductor chips, for example, a stacked structure of the first dummy rear connection electrode 140D, the second normal bonding layer 260A that is connected thereto, and the second front connection electrode 250, heat dissipation characteristics may be enhanced and the process may be improved.

Meanwhile, in the embodiments of FIGS. 1 and 2, a case in which one power rear connection electrode is connected to a pair of power through electrodes has been described. However, the present disclosure is not limited thereto, and one power rear connection electrode may be connected to three or more power through electrodes. That is, one power rear connection electrode may correspond to a plurality of power through electrodes. This will be exemplarily described with reference to FIGS. 4A to 5.

Figure 4A:
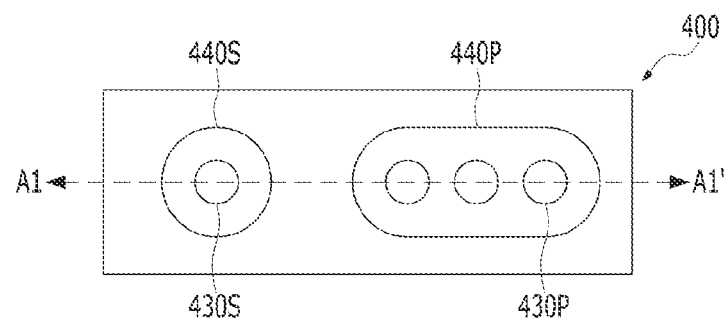
FIG. 4A is a plan view, illustrating a semiconductor chip, according to another embodiment of the present disclosure.
Figure 4B:
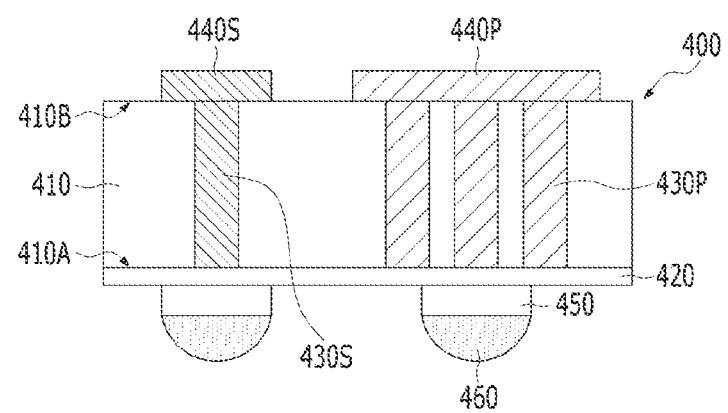
FIG. 4B is a cross-sectional view that is taken along a line A1-A1' of FIG. 4A.

FIG. 4A is a plan view, illustrating a semiconductor chip, according to another embodiment of the present disclosure, and FIG. 4B is a cross-sectional view that is taken along a line A1-A1' of FIG. 4A. For convenience of description, one signal rear connection electrode and one power rear connection electrode are mainly illustrated.

Referring to FIGS. 4A and 4B, a semiconductor chip 400 of the present embodiment may include a body portion 410 with a front surface 410A and a rear surface 410B, a wiring portion 420 that is disposed over the front surface 410A of the body portion 410, a signal through electrode 430S and a power through electrode 430P that penetrate the body portion 410, a signal rear connection electrode 440S and a power rear connection electrode 440P that are disposed over the rear surface 410B of the body portion 410 and connected to the signal through electrode 430S and the power through electrode 430P, respectively, a front connection electrode 450 that is disposed over the wiring portion 420 and connected to the signal through electrode 430S and power through electrode 430P through the wiring portion 420, and a bonding layer 460 that is disposed over the front connection electrode 450.

Here, one signal rear connection electrode 440S may overlap and connect with one signal through electrode 430S. On the other hand, one power rear connection electrode 440P may overlap and connect simultaneously with three power through electrodes 430P. The three power through electrodes 430P may be arranged in a line in one direction, for example, in a direction parallel to the line A1-A1'. The power rear connection electrode 440P may have a bar shape with a long axis in one direction and a short axis in a direction crossing the one direction.

According to the present embodiment, because the power is supplied through the three power through electrodes 430P, the resistance of the power supply path may be further reduced.

Figure 5:
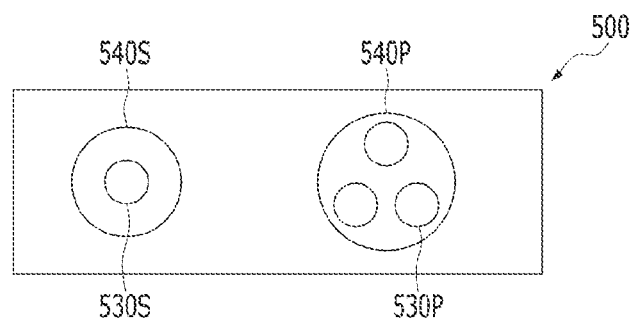
FIG. 5 is a plan view, illustrating a semiconductor chip, according to another embodiment of the present disclosure.

FIG. 5 is a plan view, illustrating a semiconductor chip, according to another embodiment of the present disclosure. For convenience of description, one signal rear connection electrode and one power rear connection electrode are mainly illustrated.

Referring to FIG. 5, in a semiconductor chip 500 of the present embodiment, one signal rear connection electrode 540S may overlap and connect with one signal through electrode 530S. On the other hand, one power rear connection electrode 540P may overlap and connect simultaneously with three power through electrodes 530P. In this case, each of the three power through electrodes 530P may be disposed at a vertex of a triangle. The power rear connection electrode 540P may have a circular shape that overlaps with this triangle or a similar shape.

According to the present embodiment, because the power is supplied through the three power through electrodes 530P, the resistance of the power supply path may be further reduced.

The embodiments of FIGS. 4A to 5 may be variously modified. For example, when a plurality of power through electrodes are connected to one power rear connection electrode at the same time, the plurality of power through electrodes may be arranged in a line, or may be disposed at a vertex of a polygon, respectively. In addition, the plurality of power through electrodes may be arranged in various ways.

A plurality of power through electrodes connected to one rear connection electrode may be referred to as a group of power through electrodes. That is, the pair of power through electrodes 130P of FIG. 1, the pair of first power through electrodes 130P and the pair of second power through electrodes 230P of FIG. 2, the three power through electrodes 430P of FIGS. 4A and 4B, and the three power through electrodes 530P of FIG. 5, may form a group of power through electrodes.

Figure 6:
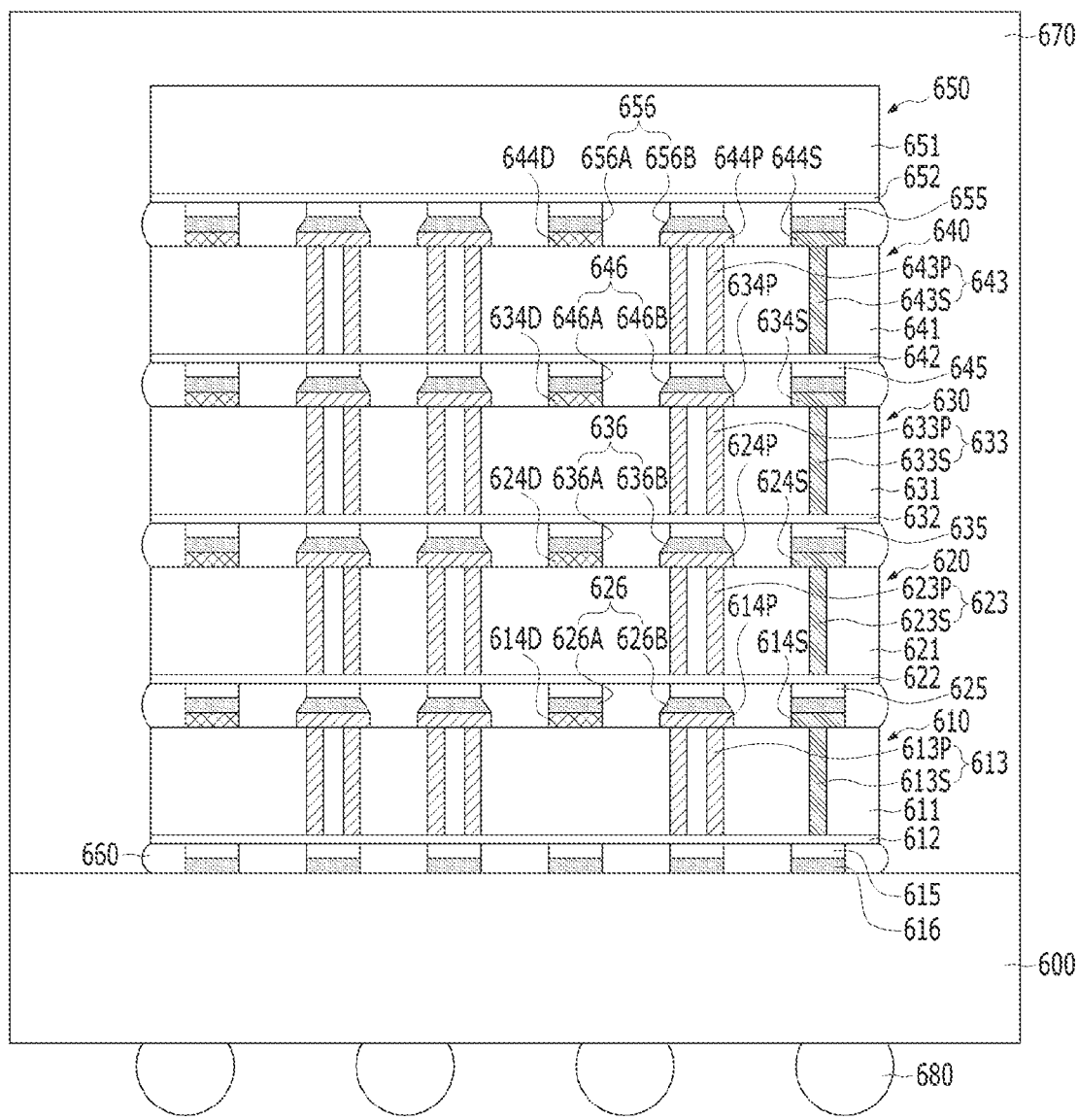
FIG. 6 is a cross-sectional view, illustrating a semiconductor package, according to an embodiment of the present disclosure.

FIG. 6 is a cross-sectional view, illustrating a semiconductor package, according to an embodiment of the present disclosure. The semiconductor package according to the present embodiment may include a plurality of semiconductor chips stacked in a vertical direction. Each of the plurality of semiconductor chips may include substantially the same semiconductor chip as the semiconductor chip of the above-described embodiments.

Referring to FIG. 6, the semiconductor package of the present embodiment may include a base layer 600, and a plurality of semiconductor chips 610, 620, 630, 640, and 650 that are stacked over the base layer 600 in a vertical direction. In the present embodiment, five semiconductor chips 610, 620, 630, 640, and 650 are stacked, but the present disclosure is not limited thereto, and the number of semiconductor chips stacked in the vertical direction may be variously modified. For convenience of description, the five semiconductor chips 610, 620, 630, 640, and 650 will be referred to as a first semiconductor chip 610, a second semiconductor chip 620, a third semiconductor chip 630, a fourth semiconductor chip 640, and a fifth semiconductor chip 650, according to the distance from the base layer 600.

The base layer 600 may be a layer with a circuit and/or wiring structure in order to connect the stacked structure of the plurality of semiconductor chips 610, 620, 630, 640, and 650 with external components. For example, the base layer 600 may include a substrate, such as a printed circuit board (PCB), an interposer, a redistribution layer, or the like. Alternatively, when the plurality of semiconductor chips 610, 620, 630, 640, and 650 are memory chips, the base layer 600 may be a semiconductor chip with a logic circuit supporting operations of these memory chips, for example, an operation of reading data from the memory chips or an operation of writing data to the memory chips.

The base layer 600 may have an upper surface on which the plurality of semiconductor chips 610, 620, 630, 640, and 650 are disposed, and a lower surface on which an external connection terminal 680 that connects the semiconductor package to an external component is disposed while being located on the opposite side of the upper surface.

Each of the first to fourth semiconductor chips 610, 620, 630, and 640, except for the fifth semiconductor chip 650 positioned at the uppermost portion of the first to fifth semiconductor chips 610, 620, 630, 640, and 650, may be substantially the same as the semiconductor chip (see 100 in FIG. 1) of the above-described embodiment, except for the shapes of bonding layers 616, 626, 636, and 646.

That is, the first semiconductor chip 610 may include a body portion 611 with front and rear surfaces, a wiring portion 612 that is disposed over the front surface of the body portion 611, a through electrode 613 that penetrates the body portion 611, a rear connection electrode 614 that is disposed over the rear surface of the body portion 611 and connected to the through electrode 613, a front connection electrode 615 that is disposed over the wiring portion 612, and a bonding layer 616 that is disposed over the front connection electrode 615. The through electrode 613 may include a signal through electrode 613S and a power through electrode 613P. The rear connection electrode 614 may include a signal rear connection electrode 614S, a power rear connection electrode 614P, and a dummy rear connection electrode 614D. The bonding layer 616 may be bonded to the upper surface of the base layer 600 and may have the same shape/size.

The second semiconductor chip 620 may include a body portion 621 with front and rear surfaces, a wiring portion 622 that is disposed over the front surface of the body portion 621, a through electrode 623 that penetrates the body portion 621, a rear connection electrode 624 that is disposed over the rear surface of the body portion 621 and connected to the through electrode 623, a front connection electrode 625 that is disposed over the wiring portion 622, and a bonding layer 626 that is disposed over the front connection electrode 625. The through electrode 623 may include a signal through electrode 623S and a power through electrode 623P. The rear connection electrode 624 may include a signal rear connection electrode 624S, a power rear connection electrode 624P, and a dummy rear connection electrode 624D. The bonding layer 626 may be bonded to the rear connection electrode 614 of the first semiconductor chip 610. The bonding layer 626 may include a normal bonding layer 626A that is bonded to each of the signal rear connection electrode 614S and the dummy rear connection electrode 614D of the first semiconductor chip 610, and an oblique bonding layer 626B that is bonded to the power rear connection electrode 614P of the first semiconductor chip 610.

Because each of the third semiconductor chip 630 and the fourth semiconductor chip 640 has the same structure as the second semiconductor chip 620, a detailed description thereof will be omitted. The third semiconductor chip 630 may include a body portion 631, a wiring portion 632, a through electrode 633 with a signal through electrode 633S and a power through electrode 633P, a rear connection electrode 634 with a signal rear connection electrode 634S, a power rear connection electrode 634P, and a dummy rear connection electrode 634D, a front connection electrode 635, and a bonding layer 636 with a normal bonding layer 636A and an oblique bonding layer 636B. The fourth semiconductor chip 640 may include a body portion 641, a wiring portion 642, a through electrode 643 with a signal through electrode 643S and a power through electrode 643P, a rear connection electrode 644 with a signal rear connection electrode 644S, a power rear connection electrode 644P, and a dummy rear connection electrode 644D, a front connection electrode 645, and a bonding layer 646 with a normal bonding layer 646A and an oblique bonding layer 646B.

Because the fifth semiconductor chip 650 is positioned at the uppermost portion, it might not include a through electrode and a rear connection electrode. That is, as shown, the fifth semiconductor chip 650 may include a body portion 651 with front and rear surfaces, a wiring portion 652 that is disposed over the front surface of the body portion 651, a front connection electrode 655 that is disposed over the wiring portion 652, and a bonding layer 656 that is disposed over the front connection electrode 655. The bonding layer 656 may include a normal bonding layer 656A and an oblique bonding layer 656B.

Spaces between the first semiconductor chip 610 and the base layer 600, between the first semiconductor chip 610 and the second semiconductor chip 620, between the second semiconductor chip 620 and the third semiconductor chip 630, between the third semiconductor chip 630 and the fourth semiconductor chip 640, and between the fourth semiconductor chip 640 and the fifth semiconductor chip 650, may be filled with a gap-fill material 660. The gap-fill material 660 may be formed by flowing an underfill material into the spaces through a capillary phenomenon, and then curing.

In addition, the base layer 600 and the first to fifth semiconductor chips 610, 620, 630, 640, and 650 may be surrounded by a molding layer 670. That is, the molding layer 670 may be formed to cover the first to fifth semiconductor chips 610, 620, 630, 640, and 650 over the upper surface of the base layer 600. The molding layer 670 may include various molding materials, such as EMC (Epoxy Mold Compound). As an example, when the gap-fill material 660 is omitted, the molding layer 670 may be formed to fill the spaces between the first semiconductor chip 610 and the base layer 600, between the first semiconductor chip 610 and the second semiconductor chip 620, between the second semiconductor chip 620 and the third semiconductor chip 630, between the third semiconductor chip 630 and the fourth semiconductor chip 640, and between the fourth semiconductor chip 640 and the fifth semiconductor chip 650.

According to the semiconductor package of the present embodiment, all of the advantages described in the embodiment of FIG. 2 may be obtained.

Figure 7:
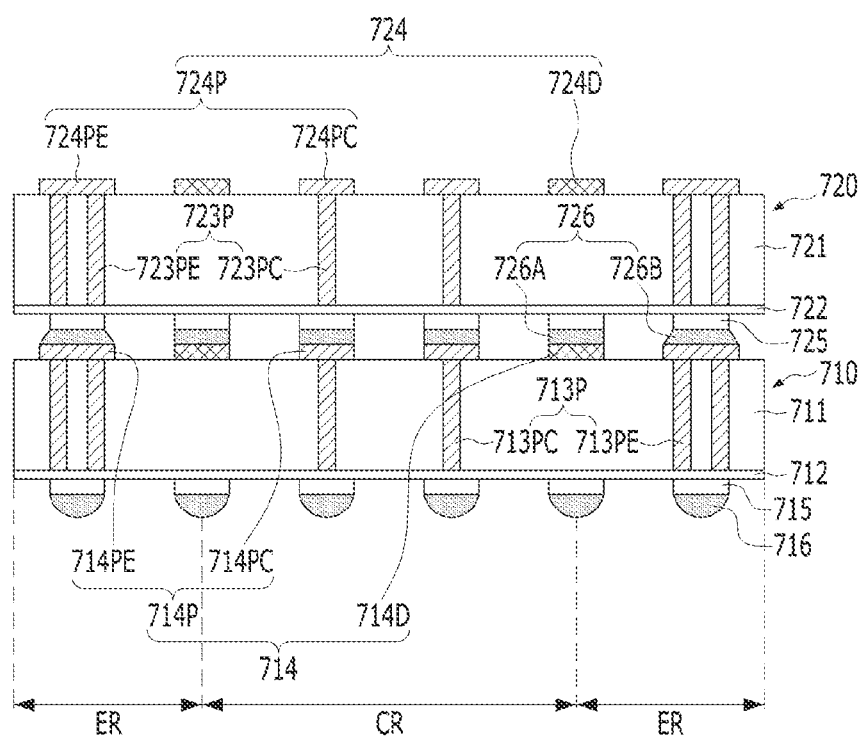
FIG. 7 is a cross-sectional view, illustrating stacked semiconductor chips, according to another embodiment of the present disclosure.

FIG. 7 is a cross-sectional view, illustrating stacked semiconductor chips, according to another embodiment of the present disclosure, FIG. 7 shows a case in which two semiconductor chips are stacked in a vertical direction. The description will focus on differences from the above-described embodiment of FIG. 2. In addition, for convenience of description, in the present embodiment, a signal transmission path, that is, a signal through electrode, a signal rear connection electrode, and components electrically connected thereto are omitted.

Referring to FIG. 7, a second semiconductor chip 720 may be stacked over a first semiconductor chip 710.

The first semiconductor chip 710 may include a first body portion 711 with front and rear surfaces, a first wiring portion 712 that is disposed over the front surface of the first body portion 711, a first power through electrode 713P that penetrates the first body portion 711, a first power rear connection electrode 714P that is disposed over the rear surface of the first body portion 711 and connected to the first power through electrode 713P, a first front connection electrode 715 that is disposed over the first wiring portion 712 and connected to the first power through electrode 713P through the first wiring portion 712, and a first bonding layer 716 that is disposed over the first front connection electrode 715. Further, the first semiconductor chip 710 may further include a first dummy rear connection electrode 714D that is not connected to the first power through electrode 713P. In this case, the first front connection electrode 715 may be further formed at a position that corresponds to the first dummy rear connection electrode 714D. The first dummy rear connection electrode 714D and the first power rear connection electrode 714P may be referred to as a first rear connection electrode 714.

The first semiconductor chip 710 may include edge regions ER that is adjacent to both side surfaces of the first semiconductor chip 710 in a horizontal direction, respectively, and a central region CR that is positioned between the edge regions ER.

The first power through electrode 713P may include a first edge power through electrode 713PE that is located in the edge region ER, and a first central power through electrode 713PC located in the central region CR. In addition, the first power rear connection electrode 714P may include a first edge power rear connection electrode 714PE that is connected to the first edge power through electrode 713PE in the edge region ER, and a first central power rear connection electrode 714PC that is connected to the first central power through electrode 713PC in the central region CR.

Here, the first central power rear connection electrode 714PC may be formed to overlap and connect with each first central power through electrode 713PC. That is, one first central power rear connection electrode 714PC may correspond to one first central power through electrode 713PC. Accordingly, the first central power rear connection electrode 714PC may be formed to have a relatively small width/size. For example, the width/size of the first central power rear connection electrode 714PC may be substantially the same as the width/size of the first dummy rear connection electrode 714D, the width/size of the first front connection electrode 715, and/or a width/size of a signal rear connection electrode (not shown).

On the other hand, the first edge power rear connection electrode 714PE may be formed to simultaneously connect with two or more first edge power through electrodes 713PE. That is, one first edge power rear connection electrode 714PE may correspond to a plurality of first edge power through electrodes 713PE. For this reason, the width/size of the first edge power rear connection electrode 714PE may be formed relatively large. For example, the width/size of the first edge power rear connection electrode 714PE may be greater than the width/size of the first central power rear connection electrode 714PC, the width/size of the first dummy rear connection electrode 714D, the width/size of the first front connection electrode 715 and/or a width/size of a signal rear connection electrode (not shown).

The second semiconductor chip 720 may include a second body portion 721 with front and rear surfaces, a second wiring portion 722 that is disposed over the front surface of the second body portion 721, a second power through electrode 723P that penetrates the second body portion 721, a second power rear connection electrode 724P that is disposed over the rear surface of the second body portion 721 and connected to the second power through electrode 723P, a second front connection electrode 725 that is disposed over the second wiring portion 722 and connected to the second power through electrode 723P through the second wiring portion 722, and a second bonding layer 726 that is disposed over the second front connection electrode 725. Further, the second semiconductor chip 720 may further include a second dummy rear connection electrode 724D that is not connected to the second power through electrode 723P. In this case, the second front connection electrode 725 may be further formed at a position that corresponds to the second dummy rear connection electrode 724D. The second dummy rear connection electrode 724D and the second power rear connection electrode 724P may be referred to as a second rear connection electrode 724.

The second semiconductor chip 720 may include edge regions ER that is adjacent to both side surfaces of the second semiconductor chip 720 in a horizontal direction, respectively, and a central region CR that is positioned between the edge regions ER. Because the first semiconductor chip 710 and the second semiconductor chip 720 are stacked with their both side surfaces aligned, the edge region ER and the central region CR of the second semiconductor chip 720 may overlap with the edge region ER and the central region CR of the first semiconductor chip 710, respectively.

The second power through electrode 723P may include a second edge power through electrode 723PE that is located in the edge region ER, and a second central power through electrode 723PC that is located in the central region CR. In addition, the second power rear connection electrode 724P may include a second edge power rear connection electrode 724PE that is connected to the second edge power through electrode 723PE in the edge region ER, and a second central power rear connection electrode 724PC that is connected to the second central power through electrode 723PC in the central region CR.

Here, the second central power rear connection electrode 724PC may be formed to overlap and connect with each second central power through electrode 723PC. That is, one second central power rear connection electrode 724PC may correspond to one second central power through electrode 723PC. Accordingly, the second central power rear connection electrode 724PC may be formed to have a relatively small width/size.

On the other hand, the second edge power rear connection electrode 724PE may be formed to simultaneously connect with two or more second edge power through electrodes 723PE. That is, one second edge power rear connection electrode 724PE may correspond to a plurality of second edge power through electrodes 723PE. For this reason, the width/size of the second edge power rear connection electrode 724PE may be formed relatively large.

The second bonding layer 726 may include a second oblique bonding layer 726B that is bonded to the first edge power rear connection electrode 714PE, and a second normal bonding layer 726A that is bonded to the first central power rear connection electrode 714PC and/or the first dummy rear connection electrode 714D.

When a plurality of semiconductor chips with through electrodes are stacked, deterioration of power supply may be more severe in the edge region than in the central region. Accordingly, in the present embodiment, the power may be supplied by using one power through electrode 713PC and 723PC in the central region CR, and by using two or more power through electrodes 713PE and 723PE in the edge region ER to facilitate to supply the power. When the first and second semiconductor chips 710 and 720 of the present embodiment are memory chips, the edge region ER may correspond to a cell mat in which a plurality of memory cells are arranged, and the central region CR may correspond to a peripheral circuit region in which a peripheral circuit for driving the cell mat is disposed.

However, the present disclosure is not limited to these regions, and if necessary, any one of power rear connection electrodes may be connected to a power through electrode group with two or more power through electrodes, and another one of the power rear connection electrodes may be connected to a single power through electrode. Even in this case, the width/size of the power rear connection electrode that is connected to the power through electrode group may be greater than the width/size of the power rear connection electrode that is connected to the single power through electrode.

According to the above embodiments of the present disclosure, it may be possible to provide a semiconductor chip with a through electrode, and a semiconductor package with the semiconductor chip, which are capable of enhancing operation characteristics and improving the process.

Figure 8:
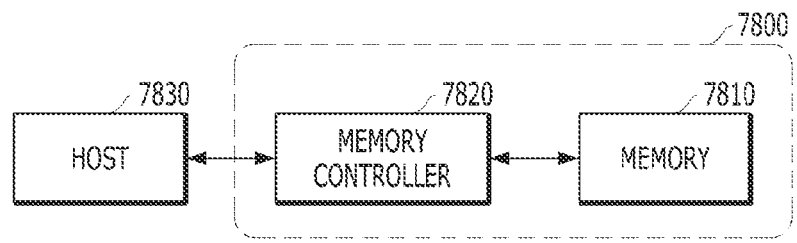
FIG. 8 shows a block diagram illustrating an electronic system employing a memory card including a semiconductor package, according to an embodiment.

FIG. 8 shows a block diagram illustrating an electronic system including a memory card 7800 employing at least one of the semiconductor packages according to the embodiments. The memory card 7800 includes a memory 7810, such as a nonvolatile memory device, and a memory controller 7820. The memory 7810 and the memory controller 7820 may store data or read out the stored data. At least one of the memory 7810 and the memory controller 7820 may include at least one of the semiconductor packages according to described embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 9:
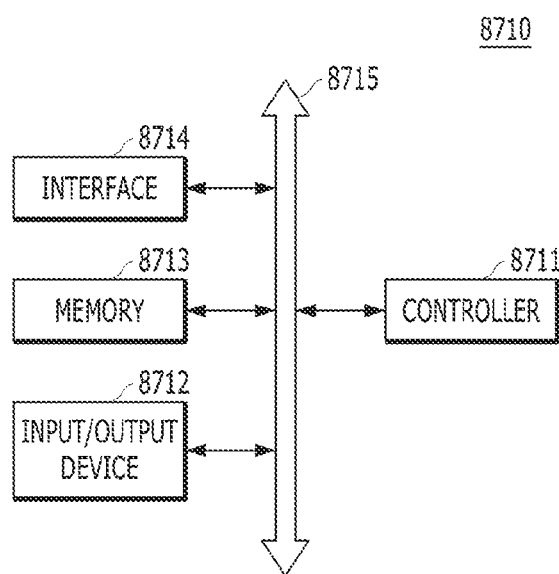
FIG. 9 shows a block diagram illustrating another electronic system including a semiconductor package, according to an embodiment

FIG. 9 shows a block diagram illustrating an electronic system 8710 including at least one of the semiconductor packages according to described embodiments. The electronic system 8710 may include a controller 8711, an input/output device 8712, and a memory 8713. The controller 8711, the input/output device 8712, and the memory 8713 may be coupled with one another through a bus 871S providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 represents equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution), or Wibro (wireless broadband Internet).

Although various embodiments have been described for illustrative purposes, it will be apparent to those skilled in the art that various changes and modifications may be made without departing from the spirit and scope of the present teachings as defined in the following claims.

What is claimed is:

1. A semiconductor chip comprising:
   a body portion with a front surface and a rear surface;
   a through electrode penetrating the body portion;
   a wiring portion that is disposed over the front surface of the body portion;
   a rear connection electrode that is disposed over the rear surface of the body portion; and
   a front connection electrode that is disposed over the wiring portion,
   wherein the rear connection electrode includes a power rear connection electrode that is simultaneously connected to two or more power through electrodes,
   wherein a width of the power rear connection electrode is greater than a width of the front connection electrode,
   wherein the rear connection electrode further includes a dummy rear connection electrode that is not connected to the through electrode, and
   wherein the width of the power rear connection electrode is greater than a width of the dummy rear connection electrode.

2. The semiconductor chip according to claim 1, wherein the rear connection electrode further includes a signal rear connection electrode that is connected to one signal through electrode, and
   wherein the width of the power rear connection electrode is greater than a width of the signal rear connection electrode.

3. The semiconductor chip according to claim 1, wherein a pitch between a plurality of rear connection electrodes is constant.

4. The semiconductor chip according to claim 1, wherein the two or more power through electrodes are arranged in a line.

5. The semiconductor chip according to claim 1, wherein each of the two or more power through electrodes is disposed at a vertex of a polygon.

6. The semiconductor chip according to claim 1, wherein the rear connection electrode further includes an other power rear connection electrode that is connected to one power through electrode, and
   wherein the width of the power rear connection electrode is greater than a width of the other power rear connection electrode.

7. The semiconductor chip according to claim 6, wherein the power rear connection electrode is disposed in an edge region, and
   wherein the other power rear connection electrode is disposed in a central region.

8. A semiconductor chip comprising:
   a body portion with a front surface and a rear surface;
   a through electrode penetrating the body portion; and
   a rear connection electrode that is disposed over the rear surface of the body portion,
   wherein the rear connection electrode includes a power rear connection electrode that is simultaneously connected to two or more power through electrodes,
   wherein a width of the power rear connection electrode is greater than that of other rear connection electrodes that are not the power rear connection electrode,
   wherein each of the two or more power through electrodes is disposed at a vertex of a polygon.

9. The semiconductor chip according to claim 8, wherein the other rear connection electrode includes a signal rear connection electrode that is connected to one signal through electrode, and
   wherein the width of the power rear connection electrode is greater than a width of the signal rear connection electrode.

10. The semiconductor chip according to claim 8, wherein the other rear connection electrode includes a dummy rear connection electrode that is not connected to the through electrode, and
    wherein the width of the power rear connection electrode is greater than a width of the dummy rear connection electrode.

11. The semiconductor chip according to claim 8, wherein a pitch between a plurality of rear connection electrodes is constant.

12. The semiconductor chip according to claim 8, wherein the two or more power through electrodes are arranged in a line.

13. The semiconductor chip according to claim 8, wherein the rear connection electrode further includes an other power rear connection electrode that is connected to one power through electrode, and
    wherein the width of the power rear connection electrode is greater than a width of the other power rear connection electrode.

14. The semiconductor chip according to claim 13, wherein the power rear connection electrode is disposed in an edge region, and
    wherein the other power rear connection electrode is disposed in a central region.

15. A semiconductor package comprising:
    a first semiconductor chip including a first body portion with a front surface and a rear surface, a first through electrode penetrating the first body portion, and a first rear connection electrode that is disposed over the rear surface of the first body portion; and
    a second semiconductor chip including a second body portion with a front surface and a rear surface, a second wiring portion that is disposed over the front surface of the second body portion, and a second front connection electrode that is disposed over the second wiring portion,
    wherein the first rear connection electrode and the second front connection electrode are electrically connected to each other,
    the first rear connection electrode includes a first power rear connection electrode that is simultaneously connected to two or more first power through electrodes, and
    a width of the first power rear connection electrode is greater than a width of the second front connection electrode.

16. The semiconductor package according to claim 15, wherein the first rear connection electrode further includes a first signal rear connection electrode that is connected to one first signal through electrode, and
wherein the width of the first power rear connection electrode is greater than a width of the first signal rear connection electrode.

17. The semiconductor package according to claim 15, wherein the first rear connection electrode further includes a first dummy rear connection electrode that is not connected to the first through electrode, and
wherein the width of the first power rear connection electrode is greater than a width of the first dummy rear connection electrode.

18. The semiconductor package according to claim 15, wherein a pitch between a plurality of first rear connection electrodes is constant, and
wherein a pitch between a plurality of second front connection electrodes that are connected to the plurality of first rear connection electrodes, respectively, is constant.

19. The semiconductor package according to claim 15, wherein the two or more first power through electrodes are arranged in a line.

20. The semiconductor package according to claim 15, wherein each of the two or more first power through electrodes is disposed at a vertex of a polygon.

21. The semiconductor package according to claim 15, wherein the first rear connection electrode further includes a first other power rear connection electrode that is connected to one first power through electrode, and
wherein the width of the first power rear connection electrode is greater than a width of the first other power rear connection electrode.

22. The semiconductor package according to claim 21, wherein the first power rear connection electrode is disposed in an edge region, and
wherein the first other power rear connection electrode is disposed in a central region.

23. The semiconductor package according to claim 15, further comprising:
a bonding layer bonded to one surface of the first rear connection electrode and one surface of the second front connection electrode between the first rear connection electrode and the second front connection electrode,
wherein an angle, formed by a sidewall of the bonding layer that is bonded to the first power rear connection electrode and one surface of the first power rear connection electrode, is smaller than an angle, formed by a sidewall of the bonding layer that is bonded to a first other rear connection electrode, except for the first power rear connection electrode, and one surface of the first other rear connection electrode.

24. The semiconductor package according to claim 15, wherein the second semiconductor chip further includes a second through electrode that penetrates the second body portion, and a second rear connection electrodes that is disposed over the rear surface of the second body portion,
wherein the second rear connection electrode includes a second power rear connection electrode that is simultaneously connected to two or more second power through electrodes, and
wherein a width of the second power rear connection electrode is greater than the width of the second front connection electrode.

25. The semiconductor package according to claim 15, further comprising:
a bonding layer interposed between the first power rear connection electrode and the second front connection electrode, and
wherein a width of the bonding layer increases as the bonding layer approaches the first power rear connection electrode.

26. A semiconductor chip comprising:
a body portion with a front surface and a rear surface;
a plurality of through electrodes penetrating the body portion;
a wiring portion that is disposed over the front surface of the body portion;
a plurality of rear connection electrodes that are disposed over the rear surface of the body portion to be connected to respective through electrodes; and
a plurality of front connection electrodes that are disposed over the wiring portion to be connected to respective through electrodes,
wherein one or more of the rear connection electrodes are simultaneously connected to two or more through electrodes,
wherein a width of the one or more of the rear connection electrodes that are simultaneously connected to two or more through electrodes is greater than a width of the front connection electrode,
wherein the rear connection electrode further includes another power rear connection electrode that is connected to one power through electrode, and
wherein the width of the power rear connection electrode is greater than a width of the other power rear connection electrode.

* * * * *